United States Patent
Chang

(10) Patent No.: US 11,264,389 B2
(45) Date of Patent: Mar. 1, 2022

(54) STACK CAPACITOR STRUCTURE AND METHOD FOR FORMING THE SAME

(71) Applicant: NANYA TECHNOLOGY CORPORATION, New Taipei (TW)

(72) Inventor: Szu-Yao Chang, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 45 days.

(21) Appl. No.: 16/892,268

(22) Filed: Jun. 3, 2020

(65) Prior Publication Data

US 2021/0384196 A1    Dec. 9, 2021

(51) Int. Cl.
*H01L 21/20* (2006.01)
*H01L 27/108* (2006.01)
*H01L 49/02* (2006.01)
*H01L 29/94* (2006.01)

(52) U.S. Cl.
CPC .. *H01L 27/10817* (2013.01); *H01L 27/10855* (2013.01); *H01L 28/90* (2013.01); *H01L 28/91* (2013.01); *H01L 29/945* (2013.01)

(58) Field of Classification Search
CPC ................................................. H01L 29/945
USPC ................. 257/301, 306; 438/243, 386–387
See application file for complete search history.

(56) References Cited

U.S. PATENT DOCUMENTS

| | | | | |
|---|---|---|---|---|
| 6,822,280 B2* | 11/2004 | Ito | ............ | H01L 28/91 257/296 |
| 7,026,208 B2* | 4/2006 | Park | ............ | H01L 27/10852 438/239 |
| 7,094,660 B2* | 8/2006 | Park | ............ | H01L 27/10817 438/386 |
| 7,138,675 B2* | 11/2006 | Lee | ............ | H01L 27/10855 257/296 |
| 7,153,740 B2* | 12/2006 | Kim | ............ | H01L 27/10852 438/253 |
| 7,683,413 B2 | 3/2010 | Graettinger et al. | | |
| 7,919,863 B2* | 4/2011 | Benson | ............ | H01L 28/91 257/754 |

* cited by examiner

*Primary Examiner* — Calvin Lee
(74) *Attorney, Agent, or Firm* — CKC & Partners Co. LLC

(57) ABSTRACT

The stack capacitor structure includes a substrate, first, second, third, and fourth support layers, first, second, and third insulating layers, first, second, and third holes, and a capacitor. The first support layer is disposed over the substrate. The first insulating layer is disposed on the first support layer. The second support layer is disposed on the first insulating layer. The third support layer is disposed on the second support layer. The second insulating layer is disposed on the third support layer. The third insulating layer is disposed on the second insulating layer. The fourth support layer is disposed on the third insulating layer. The first hole penetrates through from the second support layer to the first support layer. The second and third holes penetrate through from the fourth support layer to the third support layer. The capacitor is disposed in the first, second, and third holes.

18 Claims, 10 Drawing Sheets

STACK CAPACITOR STRUCTURE AND METHOD FOR FORMING THE SAME

BACKGROUND

Field of Invention

The present invention relates to a stack capacitor structure and method for forming the same.

Description of Related Art

In recent years there has been a dramatic increase in the packing density of DRAMs. Large DRAM devices are normally silicon based, and each cell typically embodies a single MOS field effect transistor with its source connected to a storage capacitor. This large integration of DRAMs has been accomplished by a reduction in individual cell size. However, a decrease in storage capacitance, which results from the reduction in cell size, leads to draw backs, such as a lowering source/drain ratio and undesirable signal problems in terms of reliability. In order to achieve the desired higher level of integration, it requires the technology to keep almost the same storage capacitance on a greatly reduced cell area.

It is well known that in the art of integrated circuit device manufacture, one of the primary goals is increasing the number of device that can be placed into a given unit space on the semiconductor chip. As the traditional fabrication process begin to approach the limit of reduction, considerable attention has been applied to forming device elements on over and above the wafer to take advantage of extra versatility of third dimension.

One of the successful vertically oriented integrated circuit devices is the stacked capacitor. Briefly, a stacked capacitor is formed by forming the stacked capacitor structures laying over the gate electrode on active and field oxide regions and diffusion region. The processing of such structures have become very complicated which are not in step with the very small dimensions required in the present and future state of the art. Although there has been much work done in accomplishing these small size devices and increased capacitance therein, there is still great need for devices with even greater capacitance for a given space in order to achieve even greater packing densities, and improve the DRAM products of the future.

SUMMARY

Accordingly, it is a primary object of the invention to provide a stack capacitor structure with a greater capacitance per unit area and a method of forming the same.

According to one aspect of the present disclosure, a stack capacitor structure is provided. The stack capacitor structure includes a substrate, a first support layer, a first insulating layer, a second support layer, a third support layer, a second insulating layer, a third insulating layer, a fourth support layer, a first hole, a second hole, a third hole, and a capacitor. The first support layer is disposed over the substrate. The first insulating layer is disposed on the first support layer. The second support layer is disposed on the first insulating layer. The third support layer is disposed on the second support layer. The second insulating layer is disposed on the third support layer. The third insulating layer is disposed on the second insulating layer. The fourth support layer is disposed on the third insulating layer. The first hole penetrates through from a top surface of the second support layer to a bottom surface of the first support layer. The second hole penetrates through from the third insulating layer to a bottom surface of the third support layer, wherein the second hole communicates with the first hole. The third hole penetrates through from a top surface of the fourth support layer to the third insulating layer, wherein the third hole is aligned with the second hole. The capacitor is disposed in the first, second, and third holes.

In some embodiments of the present disclosure, the stack capacitor structure further includes a wiring layer disposed between the substrate and the first support layer.

In some embodiments of the present disclosure, the first hole penetrates through a portion of the wiring layer and the capacitor electrically connects the wiring layer.

In some embodiments of the present disclosure, a material of the first insulating layer is different from that of the second insulating layer, and the second insulating layer comprises SiO doped with boro-phospho-silicate glass (BPSG).

In some embodiments of the present disclosure, materials of the first, second and fourth support layer are the same, the material of the first support layer is different from that of the third support layer, and the third support layer comprises SiN doped with carbon.

In some embodiments of the present disclosure, the stack capacitor structure further includes a fourth insulating layer disposed between the first support layer and the first insulating layer.

In some embodiments of the present disclosure, the capacitor comprises an outer electrode, a dielectric layer and an inner electrode in direct contact with each other.

In some embodiments of the present disclosure, the stack capacitor structure further includes a conductive material in direct contacts with the inner electrode, wherein the conductive material fills up the first and second hole and extends into a portion of the third hole.

In some embodiments of the present disclosure, the stack capacitor structure further includes a source/drain (S/D) feature disposed in the third hole and surrounded by the inner electrode.

In some embodiments of the present disclosure, the stack capacitor structure further includes a transistor electrically connecting to the source/drain (S/D) feature.

According to another aspect of the present disclosure, a method of forming a stack capacitor structure is provided. The method includes the operations described below. A first support layer is firstly formed over a substrate. A first insulating layer is then formed on the first support layer. A second support layer is then formed on the first insulating layer. Subsequently, a first hole penetrates through from a top surface of the second support layer to a bottom surface of the first support layer. A third support layer is then formed on the second support layer, wherein the first hole is sealed off by the third support layer. A second insulating layer is then formed on the third support layer. A third insulating layer is then formed on the second insulating layer. A fourth support layer is then formed on the third insulating layer. Subsequently, a second hole penetrates through from third insulating layer to a bottom surface of the third support layer and a third hole penetrates through from a top surface of the fourth support layer to the third insulating layer, wherein the first hole communicates with the second hole and the third hole. Thereafter, a capacitor is formed in the first, second, and third holes.

In some embodiments of the present disclosure, the method further includes the steps described below. A wiring layer is disposed between the substrate and the first support layer, wherein the wiring layer electrically connects to the capacitor.

In some embodiments of the present disclosure, the method further includes the steps described below. A fourth insulating layer is disposed between the first support layer and the first insulating layer.

In some embodiments of the present disclosure, the operation for forming the first hole includes the following steps: (i) removing first portions of the second support layer, the first insulating layer, the fourth insulating layer, and the first support layer to form a first initial hole, wherein an upper edge of the first initial hole has a first width, a lower edge of the first initial hole has a second width, and the first width is greater than the second width; and (ii) removing second portions of the second support layer, the first insulating layer, a fourth insulating layer, and the first support layer to form the first hole, wherein an upper edge of the first hole has a third width, a lower edge of the first hole has a fourth width, and the third width is substantially equal to the fourth width.

In some embodiments of the present disclosure, the operation for forming the second hole and the third hole includes the following steps: (i) removing first portions of the fourth support layer, the third insulating layer, the second insulating layer, and the third support layer to form a second initial hole, wherein an upper edge of the second initial hole has a fifth width, a lower edge of the second initial hole has a sixth width, and the fifth width is greater than the sixth width; and (ii) removing second portions of the fourth support layer, the third insulating layer, a second insulating layer, and the third support layer to form the second hole, wherein an upper edge of the second hole has a seventh width, a lower edge of the second hole has an eighth width, and the seventh width is substantially equal to the eighth width.

In some embodiments of the present disclosure, the operation for forming the capacitor includes the following steps: (i) forming an outer electrode conformally along walls of the first and second hole; (ii) forming a dielectric layer conformally on the outer electrode and a sidewall of the third hole; and (iii) forming an inner electrode conformally on the dielectric layer.

In some embodiments of the present disclosure, the method further includes the operations described below. A conductive material is formed in direct contacting with the inner electrode, wherein the conductive material fills up the first and second hole and extends into a portion of the third hole.

In some embodiments of the present disclosure, the method further includes the operations described below. A source/drain (S/D) feature is formed in the third hole, wherein the source/drain (S/D) feature is disposed on the conductive material and surrounded by the inner electrode.

In some embodiments of the present disclosure, a material of the first insulating layer is different from that of the second insulating layer, and the second insulating layer comprises SiO doped with boro-phospho-silicate glass (BPSG).

In some embodiments of the present disclosure, materials of the first, second and fourth support layer are the same, the material of the first support layer is different from that of the third support layer, and the third support layer comprises SiN doped with carbon.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
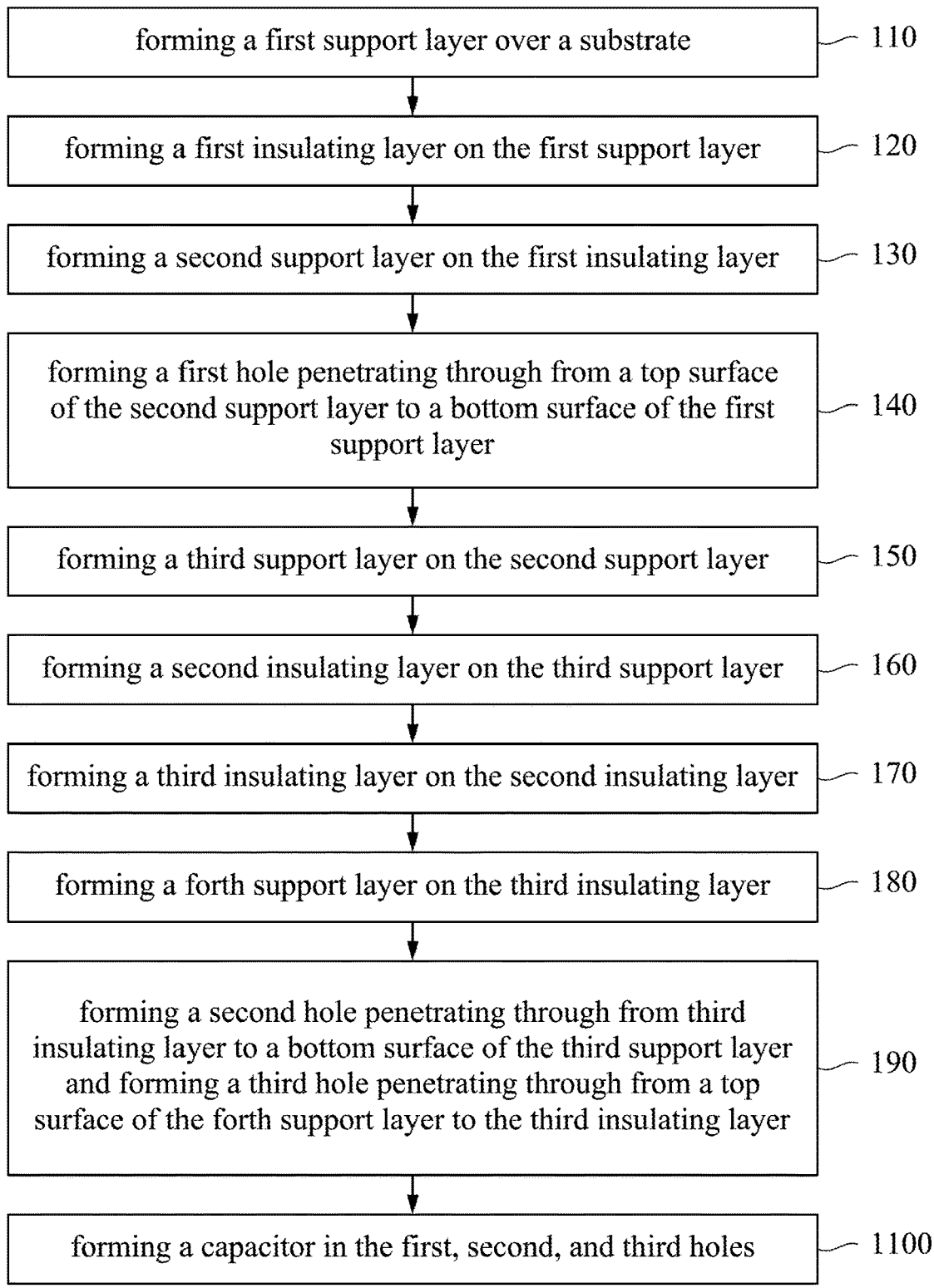
FIG. 1 is a flow chart of a method of forming a stack capacitor structure according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 9:
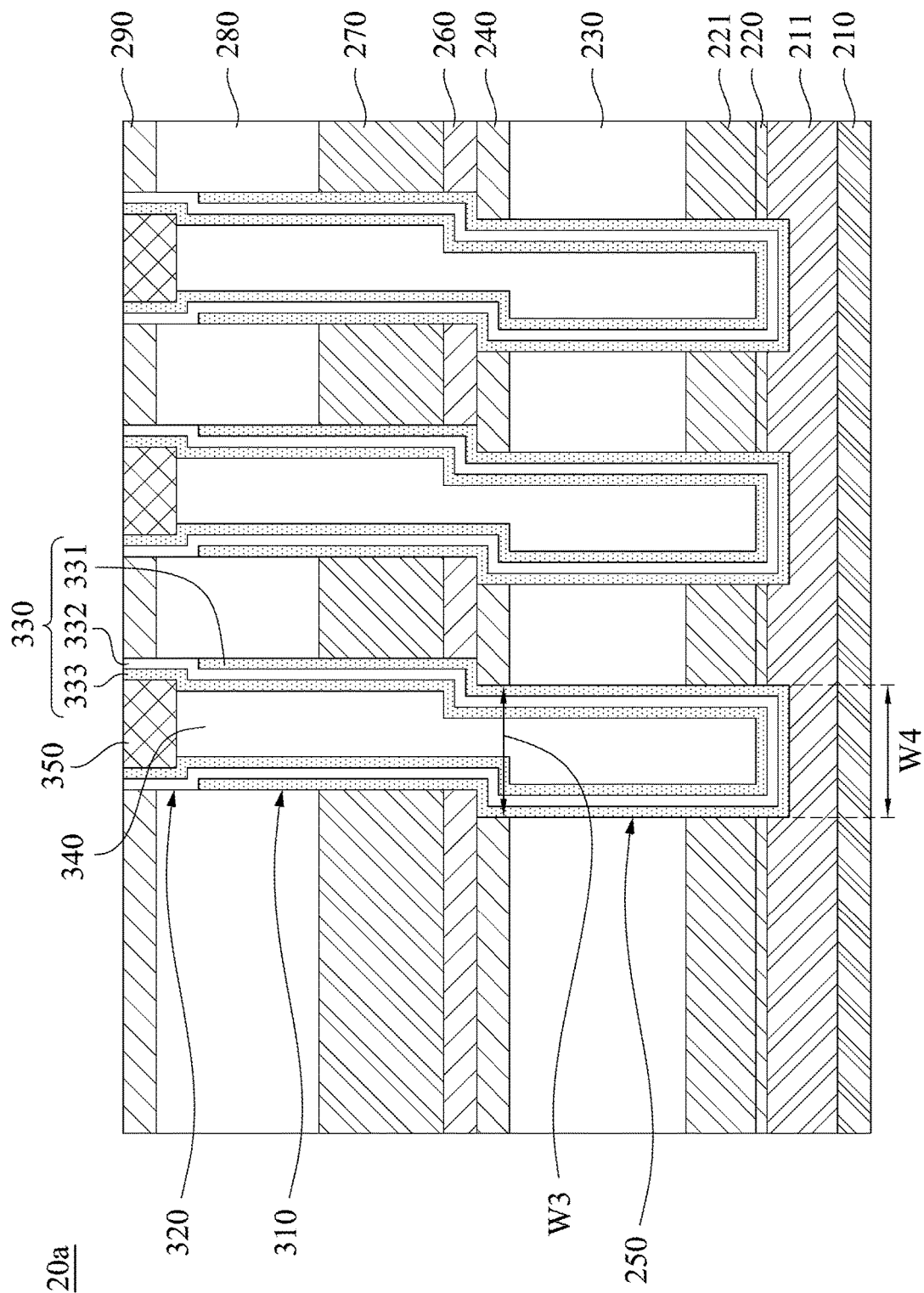
FIG. 9 is a cross-sectional view illustrating a stack capacitor structure according to some embodiments of the present disclosure.
Figure 10:
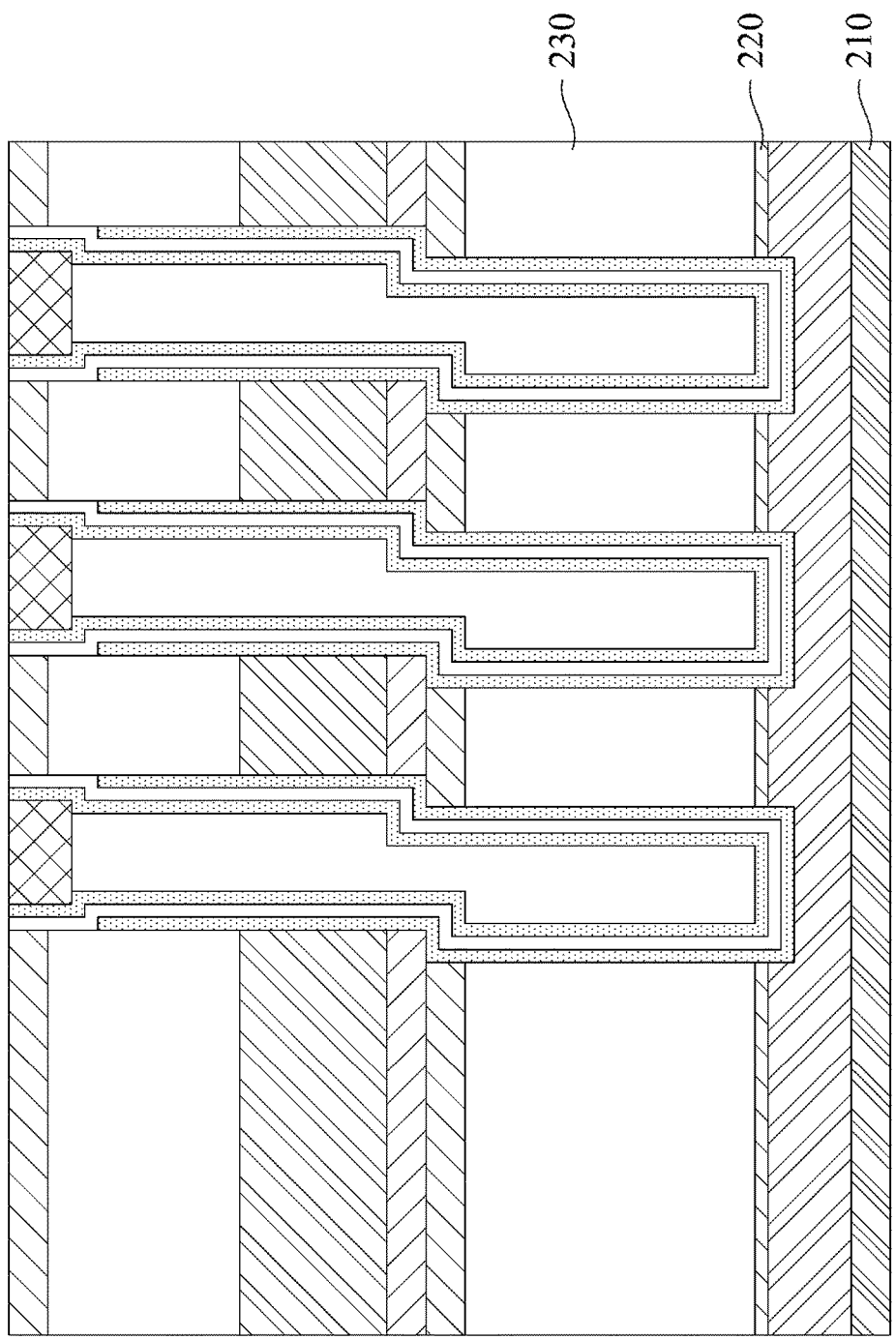
FIG. 10 illustrates a stack capacitor structure according to some embodiments of the present disclosure.

In order to increase the capacitance of the capacitor and achieve even greater packing densities, the present disclose provides stack capacitor structures 20*a*, 20*b* as shown in FIGS. 9-10. In addition, the method for forming these stack capacitor structures 20*a*, 20*b* is also novel.

Please refer to FIG. 1. FIG. 1 is a flow chart of a method 10 of forming a stack capacitor structure according to some embodiments of the present disclosure. The method 10 of forming the stack capacitor structure includes operation 110, operation 120, operation 130, operation 140, operation 150, operation 160, operation 170, operation 180, operation 190, and operation 1100.

Figure 2:
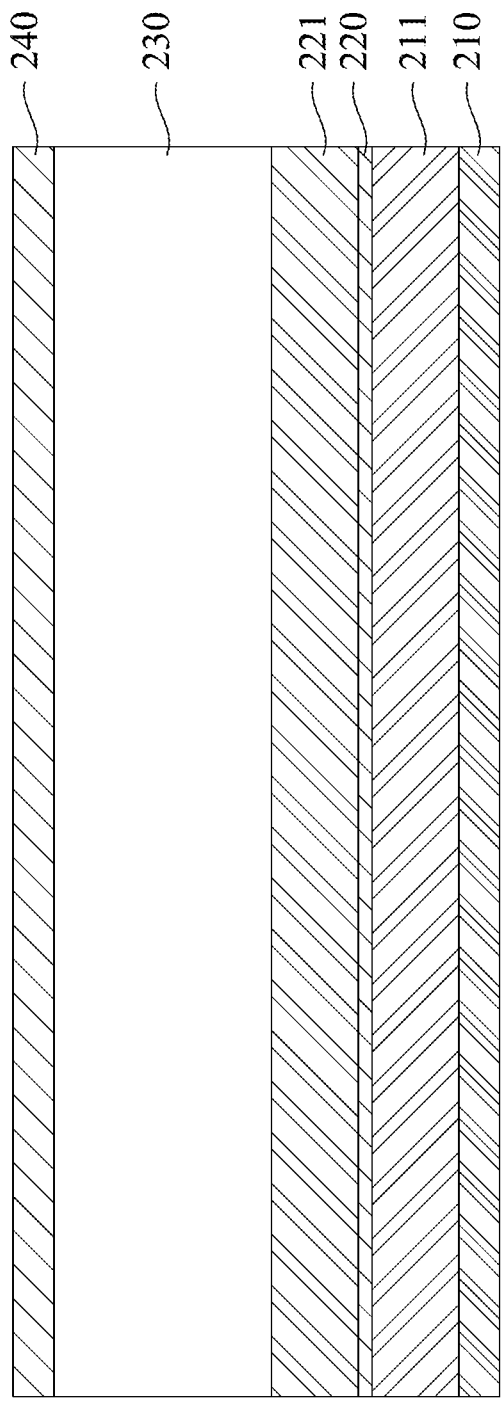
FIGS. 2, 3, 4, 5, 6, 7, and 8 are cross-sectional views illustrating various process stages of forming a stack capacitor structure according to some embodiments of the present disclosure.

In operation 110, a first support layer 220 is formed over a substrate 210. According to some embodiments, operation 110 may be further understood with reference to FIG. 2, which is cross-sectional view illustrating one of various process stages of forming the stack capacitor structure. In some embodiments, the substrate 210 may be a printed circuit board (PCB), a semiconductor substrate or other substrates known in the art. Illustrative examples of the materials of the PCB include glass fiber, epoxy resins, phenolic resins, polyimide (PI), and other suitable material, for example. Illustrative examples of the materials of the semiconductor substrate include silicon, bulk silicon, polysilicon or silicon on insulator (SOI), and a compound semiconductor, such as silicon carbide, gallium arsenide, indium arsenide, and indium phosphide. The semiconductor substrate may include various doping configurations, depending on the requirements known in the art (e.g., p-type substrate or n-type substrate). In one embodiment, the first support layer 220 includes silicon nitride (SiN). In some embodiments, the first support layer 220 may be formed over the substrate 210 by using a chemical vapor deposition (CVD) process, atomic layer deposition (ALD), physical vapor deposition (PVD), molecular-beam deposition (MBD), and other suitable processes known in the art.

In other embodiments, a wiring layer 211 may be formed between the substrate 210 and the first support layer 220. In some embodiment, the material of the wiring layer 211 may be a metal, for example, tungsten (W), aluminum (Al), copper (Cu), nickel (Ni), cobalt (Co), titanium (Ti), or other suitable metal materials. The wiring layer 211 is used to electrically connect the subsequent capacitors. The wiring layer 211 may be formed on the substrate 210 by sputtering, evaporation, physical vapor deposition (PVD), chemical vapor deposition (CVD), molecular-beam deposition (MBD), atomic layer deposition (ALD), or other suitable processes.

The method 10 continues to operation 120, a first insulating layer 230 is formed on the first support layer 220. According to some embodiments, operation 120 may be further understood with reference to FIG. 2, which is cross-sectional view illustrating one of various process stages of forming the stack capacitor structure. In one embodiment, the first insulating layer 230 includes silicon oxide (SiO). In some embodiments, the first insulating layer 230 may be formed over the first support layer 220 by using a chemical vapor deposition (CVD) process, atomic layer deposition (ALD), physical vapor deposition (PVD), molecular-beam deposition (MBD), and other suitable processes known in the art.

In other embodiments, a fourth insulating layer 221 may be selectively formed between the first support layer 220 and the first insulating layer 230. It is noted that the material of the fourth insulating layer 221 is different from that of the first insulating layer 230. To be specific, the fourth insulating layer 221 includes SiO doped with boro-phospho-silicate glass (BPSG). In some embodiments, the fourth insulating layer 221 may be formed on the first support layer 220 by using a chemical vapor deposition (CVD) process, atomic layer deposition (ALD), physical vapor deposition (PVD), molecular-beam deposition (MBD), and other suitable processes known in the art.

The method 10 continues to operation 130, a second support layer 240 is formed on the first insulating layer 230. According to some embodiments, operation 130 may be further understood with reference to FIG. 2, which is a cross-sectional view illustrating one of various process stages of forming the stack capacitor structure. In one embodiment, the second support layer 240 is a silicon nitride layer. In other words, the material of the second support layer 240 is the same as that of the first support layer 220. In some embodiments, the second support layer 240 may be formed over the first insulating layer 230 by using a chemical vapor deposition (CVD) process, atomic layer deposition (ALD), physical vapor deposition (PVD), molecular-beam deposition (MBD), and other suitable processes known in the art.

Figure 3:
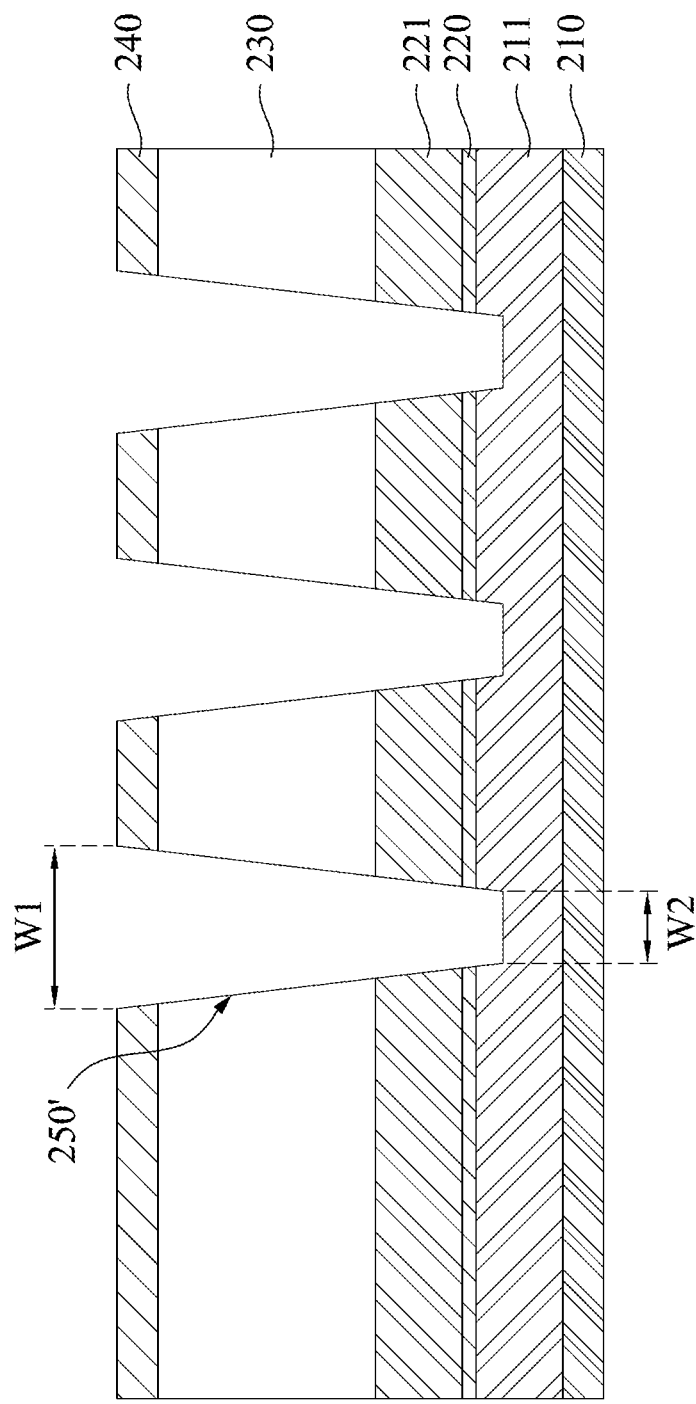
Figure 4:
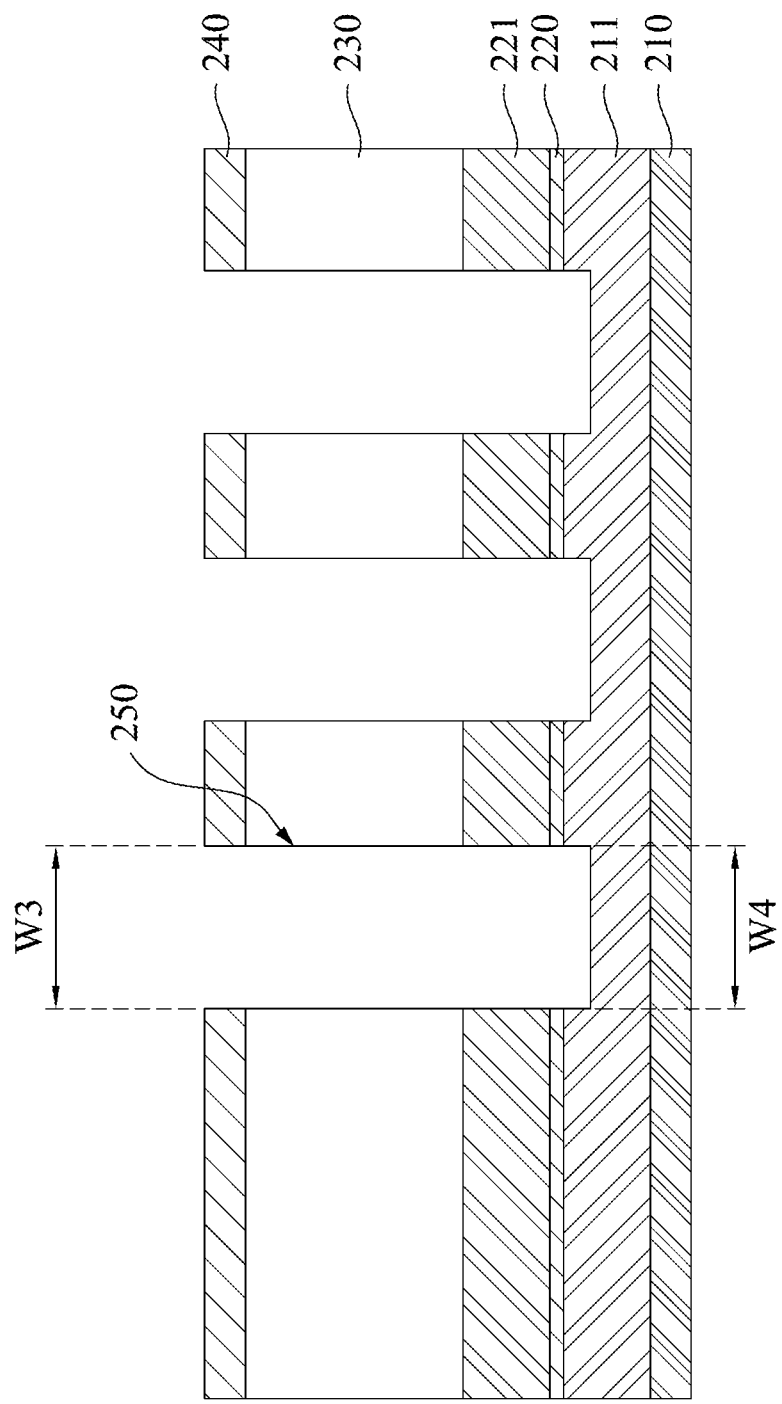

The method 10 continues to operation 140, a first hole 250 penetrates through from a top surface of the second support layer 240 to a bottom surface of the first support layer 220. According to some embodiments, operation 140 may be further understood with reference to FIGS. 3-4, which are cross-sectional view illustrating various process stages of forming the stack capacitor structure. It should be understand that the number of the first hole 250 is not limited to three as shown in FIG. 4. For example, the number of the first hole 250 may be four, five, six, or the number according to design requirements. In some embodiments, the formation of the first hole 250 includes the steps described below. Please refer to FIG. 3, the first portions of the second support layer 240, the first insulating layer 230, the fourth insulating layer 221, and the first support layer 220 are removed to form a first initial hole 250'. In some embodiments, the first initial hole 250' may be formed by appropriate processes such as a photolithography-etching process, a machine drilling process and a laser drilling process. It should be understand that an upper edge of the first initial hole 250' has a first width W1, a lower edge of the first initial hole 250' has a second width W2, and the first width W1 is greater than the second width W2. In other words, the horizontal (direction of parallel to the surface of the second support layer 240) distances between two sidewalls of the first initial hole 250' at different heights (direction of normal of the surface of the second support layer 240) are about linearly and monotonically decrease from top to bottom. In the embodiment of including the wiring layer, the first initial hole 250' extends into the wiring layer 211, but do not penetrate through the wiring layer 211.

Please refer to FIG. 4, the second portions of the second support layer 240, the first insulating layer 230, a fourth insulating layer 221, and the first support layer 220 are removed to form the first hole 250. In some embodiments, the first hole 250 may be formed by an etching process with high selection ratio. It is worth mentioning that comparing to the first insulating layer 230; the fourth insulating layer 221 has low quality because of doping boro-phospho-silicate glass (BPSG), so that the second portion of the fourth insulating layer 221 may easily be removed by the etching process with high selection ratio, thereby increasing the width of the first hole 250 in the fourth insulating layer 221. The removed second portion of the fourth insulating layer 221 is greater than the removed second portions of the second support layer 240 and the first insulating layer 230. Therefore, an upper edge of the first hole 250 has a third width W3, a lower edge of the first hole 250 has a fourth width W4, and the third width W3 is substantially equal to the fourth width W4. In the embodiment of including the wiring layer, the first hole 250 extends into the wiring layer 211, but do not penetrate through the wiring layer 211.

Figure 5:
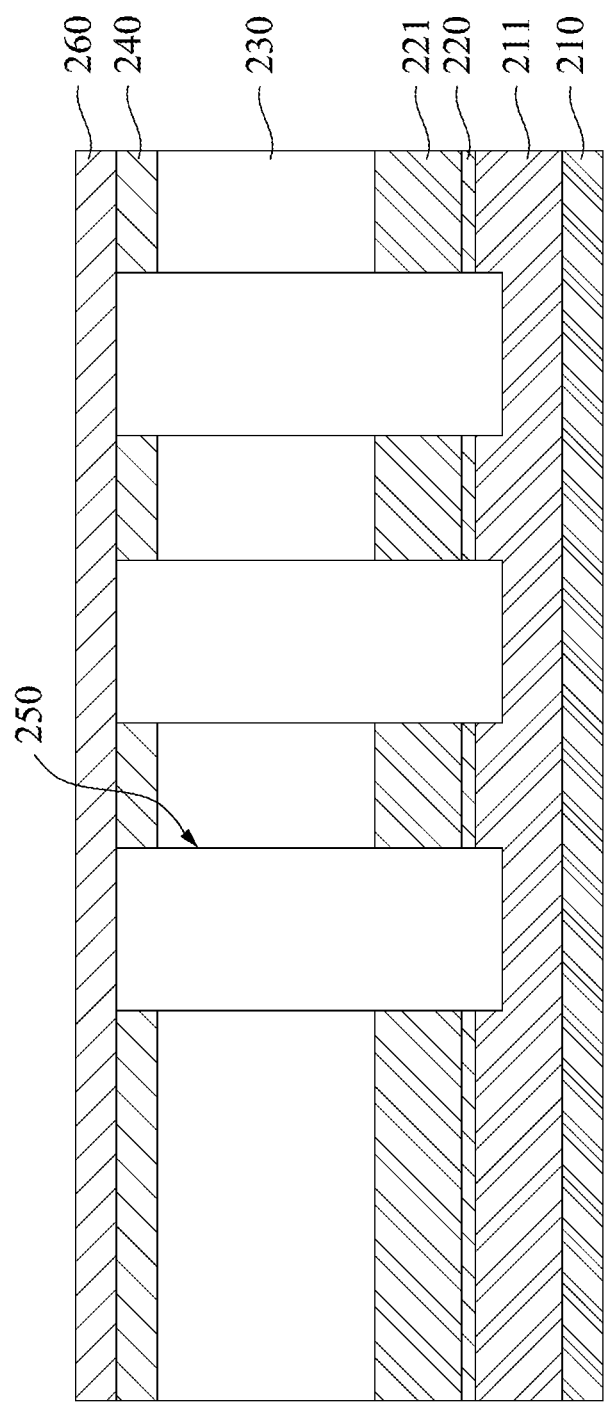

The method 10 continues to operation 150, a third support layer 260 is formed on the second support layer 240. According to some embodiments, operation 150 may be further understood with reference to FIG. 5, which is a cross-sectional view illustrating various process stages of forming the stack capacitor structure. It is noted that the first hole 250 is sealed off by the third support layer 260. In various embodiments, the material of the third support layer 260 is different from that of the second support layer 240. Specifically, third support layer 260 includes SiN doped with carbon. In some embodiments, third support layer 260 may be formed on the second support layer 240 by using a chemical vapor deposition (CVD) process, atomic layer deposition (ALD), physical vapor deposition (PVD), molecular-beam deposition (MBD), and other suitable processes known in the art. It is worth mentioning that the third support layer 260 with SiN doped with carbon has stronger mechanical properties, therefore the first hole 250 may be rapidly sealed off by the third support layer 260, thereby preventing the subsequent layers filling into the hole.

Figure 6:
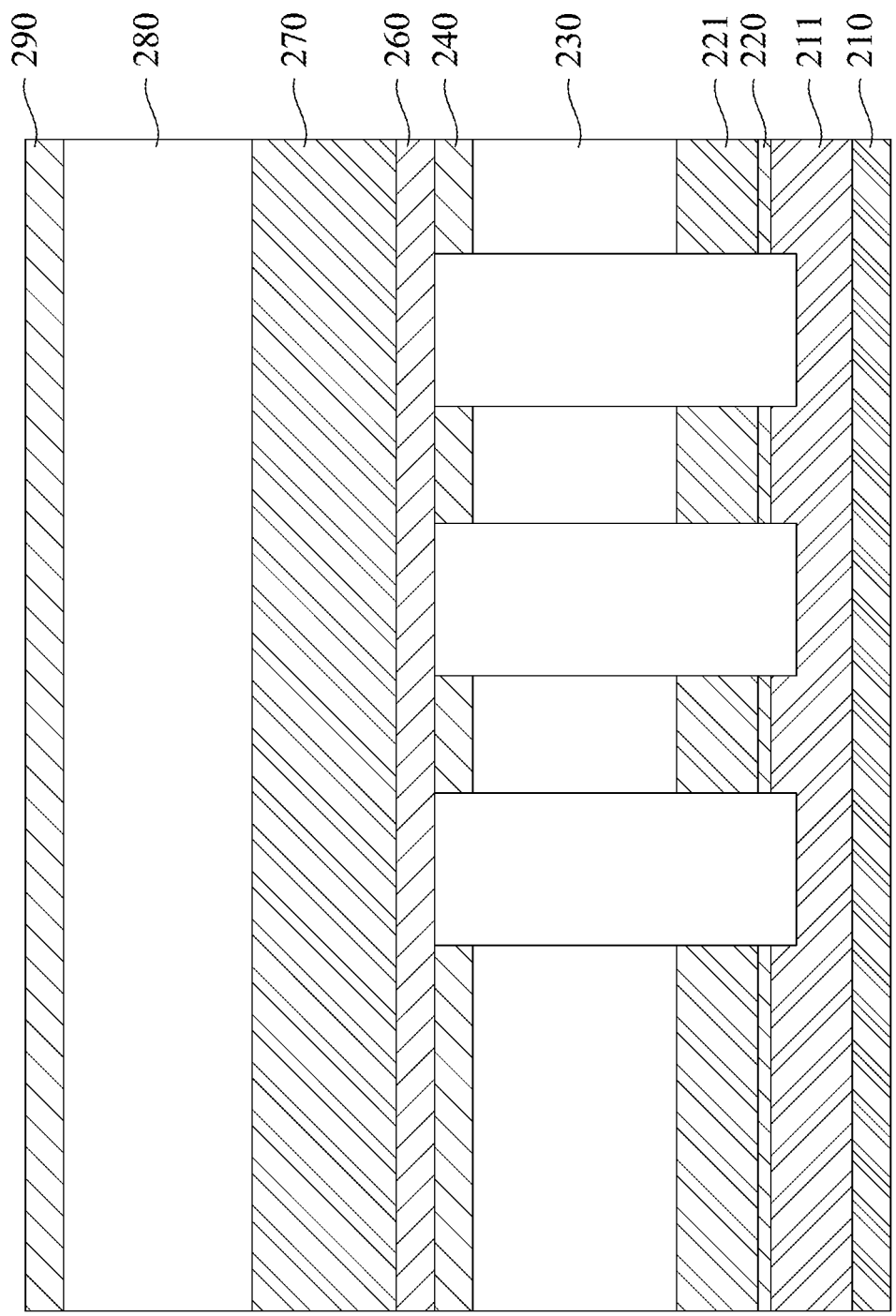

The method 10 continues to operation 160, a second insulating layer 270 is formed on the third support layer 260. According to some embodiments, operation 160 may be further understood with reference to FIG. 6, which is a cross-sectional view illustrating one of various process stages of forming the stack capacitor structure. In some embodiments, the material of the second insulating layer 270 is the same as that of the fourth insulating layer 221 but is different from that of the first insulating layer 230. Specifically, the second insulating layer 270 includes SiO doped with boro-phospho-silicate glass (BPSG). In some embodiments, the second insulating layer 270 may be formed on the third support layer 260 by using a chemical vapor deposition (CVD) process, atomic layer deposition (ALD), physical vapor deposition (PVD), molecular-beam deposition (MBD), and other suitable processes known in the art.

The method 10 continues to operation 170, a third insulating layer 280 is formed on the second insulating layer 270. According to some embodiments, operation 170 may be further understood with reference to FIG. 6, which is cross-sectional view illustrating one of various process stages of forming the stack capacitor structure. In some embodiments, the material of the third insulating layer 280 is the same as that of the first insulating layer 230. Specifically, the third insulating layer 280 includes silicon oxide (SiO). In some embodiments, the third insulating layer 280 may be formed over the second insulating layer 270 by using a chemical vapor deposition (CVD) process, atomic layer deposition (ALD), physical vapor deposition (PVD), molecular-beam deposition (MBD), and other suitable processes known in the art.

The method 10 continues to operation 180, a fourth support layer 290 is formed on the third insulating layer 280. According to some embodiments, operation 180 may be further understood with reference to FIG. 6, which is a cross-sectional view illustrating one of various process stages of forming the stack capacitor structure. In some embodiments, the material of the fourth support layer 290 is the same as that of the first support layer 220 and the second support layer 240. Specifically, the fourth support layer 290 includes silicon nitride (SiN). In some embodiments, the fourth support layer 290 may be formed over the substrate 210 by using a chemical vapor deposition (CVD) process, atomic layer deposition (ALD), physical vapor deposition (PVD), molecular-beam deposition (MBD), and other suitable processes known in the art.

Figure 7:
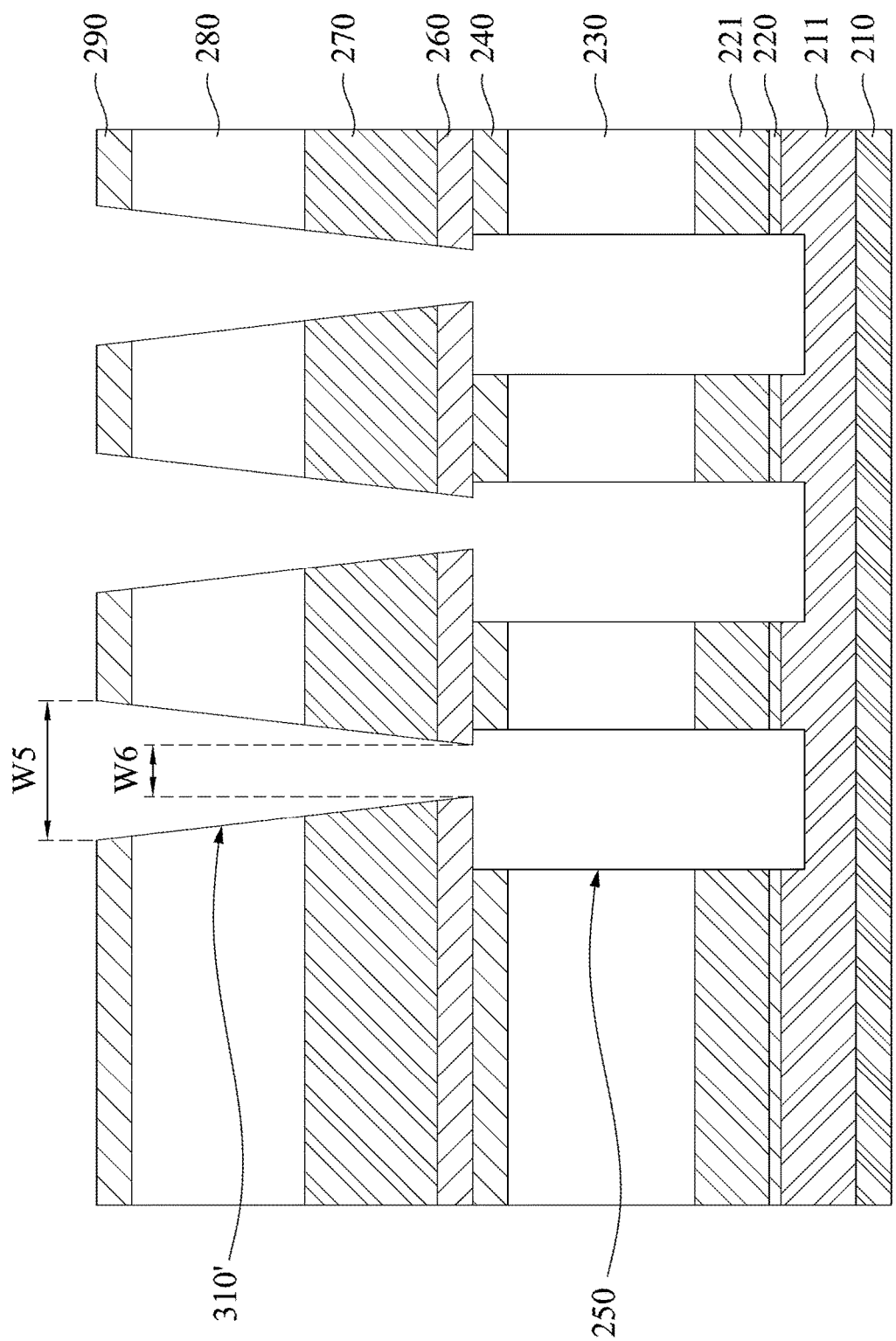
Figure 8:
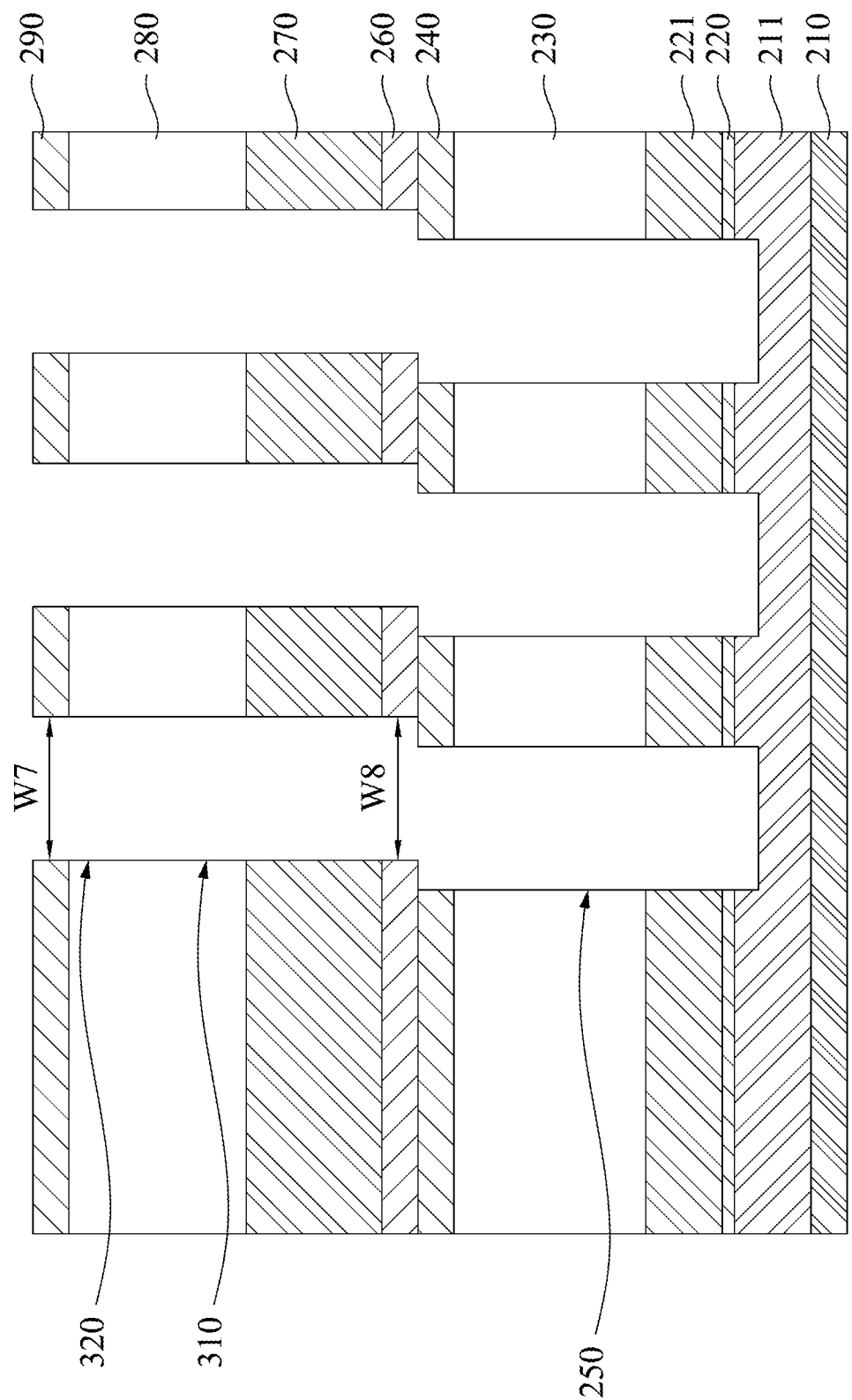

The method 10 continues to operation 190, a second hole 310 penetrates through from the third insulating layer 280 to a bottom surface of the third support layer 260 and a third hole 320 penetrates through from a top surface of the fourth support layer 290 to the third insulating layer 280. According to some embodiments, operation 190 may be further understood with reference to FIGS. 7-8, which are cross-sectional view illustrating various process stages of forming the stack capacitor structure. It should be understand that the number of the second hole 310 is not limited to three as shown in FIG. 8. For example, the number of the second hole 310 may be four, five, six, or the number according to design requirements. In some embodiments, the formation of the second hole 310 includes the steps described below. Please refer to FIG. 7, the first portions of the fourth support layer 290, the third insulating layer 280, the second insulating layer 270, and the third support layer 260 are removed to form a second initial hole 310'. In some embodiments, the second initial hole 310' may be formed by appropriate processes such as a photolithography-etching process, a machine drilling process and a laser drilling process. It should be understand that an upper edge of the second initial hole 310' has a fifth width W5, a lower edge of the second initial hole 310' has a sixth width W6, and the fifth width W5 is greater than the sixth width W6. In other words, the horizontal (direction of parallel to the surface of the fourth support layer 290) distances between two sidewalls of the second initial hole 310' at different heights (direction of normal of the surface of the fourth support layer 290) are about linearly and monotonically decrease from top to bottom.

Please refer to FIG. 8, the second portions of the fourth support layer 290, the third insulating layer 280, the second insulating layer 270, and the third support layer 260 are removed to form the second hole 310 and the third hole 320. It can be understand that the second hole 310 and the third hole 320 are formed simultaneously, and the third hole 320 is on the second hole 310 and communicate with each other. Because of forming simultaneously, the third hole 320 is aligned with the second hole 310. In various embodiments, the second hole 310 and the third hole 320 are defined by the subsequent capacitor. It will be described in detail below. In some embodiments, the second hole 310 and the third hole 320 may be formed by an etching process with high selection ratio. It is worth mentioning that comparing to the third insulating layer 280; the second insulating layer 270 has low quality because of doping boro-phospho-silicate glass (BPSG), so that the second portion of the second insulating layer 270 may easily be removed by the etching process with high selection ratio, thereby increasing the width of the holes 310, 320 in the second insulating layer 270. The removed second portion of the second insulating layer 270 is greater than the removed second portions of the fourth support layer 290 and third insulating layer 280. Therefore, an upper edge of the third hole 320 has a seventh width W7, a lower edge of the second hole 310 has an eighth width W8, and the seventh width W7 is substantially equal to the eighth width W8. It should be understand that the first hole 250 communicates with the second hole 310 and the third hole 320. In one embodiment, the second hole 310 is aligned with the first hole 250. In another embodiment, the second hole 310 is offset from the first hole 250.

The method 10 continues to operation 1100, a capacitor 330 is formed in the first, second, and third holes 250, 310, and 320. According to some embodiments, operation 190 may be further understood with reference to FIG. 9, which is a cross-sectional view illustrating a stack capacitor structure 20a according to some embodiments of the present disclosure. In some embodiments, the formation of the capacitor 330 includes the steps described below. Firstly, an outer electrode 331 is formed on walls of the first and second hole 250, 310. Specifically, the outer electrode 331 is formed conformally along walls of the first and second hole 250, 310. It is noted that the second hole 310 and the third hole 320 are defined after forming the outer electrode 331. In order to define the subsequent source/drain (S/D) feature, therefore the outer electrode 331 do not form in the third hole 320. In some embodiments, the outer electrode 331 includes titanium nitride (TiN). In some embodiments, the outer electrode 331 may be formed by using a chemical vapor deposition (CVD) process or an atomic layer deposition (ALD) process.

Please continue to refer FIG. 9. A dielectric layer 332 is then formed on the outer electrode 331 and along the wall of the third hole 320. Specifically, the dielectric layer 332 is formed conformally along the sidewall of the outer electrode 331 and wall of the third hole 320. In some embodiments, the dielectric layer 332 is a high dielectric constant layer, and the material is, for example, aluminium oxide ($AlO_3$), titanium oxide (TiO), aluminum nitride (AlN), hafnium oxide (HfO), lanthanum oxide (LaO), yttrium oxide (YO), tantalum (V) oxide (TaO), zirconium oxide (ZrO), gadolinium (GdO), or a combination thereof. In some embodiments, the dielectric layer 332 may be formed by using a chemical vapor deposition (CVD) process or an atomic layer deposition (ALD) process.

Please continue to refer FIG. 9. Subsequently, an inner electrode 333 is formed on the dielectric layer 332. Specifically, the inner electrode 333 is formed conformally along the sidewall of the dielectric layer 332. In some embodiments, the inner electrode 333 includes titanium nitride (TiN). In some embodiments, the inner electrode 333 may be formed by using a chemical vapor deposition (CVD) process or an atomic layer deposition (ALD) process.

The method 10 further includes a conductive material 340 is formed in direct contacting with the inner electrode 333 with reference to FIG. 9. Specifically, the conductive material 340 fills up the first and second hole 250, 310 and extends into a portion of the third hole 320. In some embodiments, the conductive material 340 may be a metal material or a semiconductor material. For example, the metal material may include tungsten (W), and the semiconductor material may include silicon (Si), and germanium (Ge). In some embodiments, the conductive material 340 may be formed in the holes 250, 310, 320 by using a physical vapor deposition process, a chemical vapor deposition process, and other suitable processes known in the art. It is noted that the conductive material 340 is used to provide support for the stack capacitor structure, thereby preventing collapse of the stack capacitor structure.

The method 10 further includes a source/drain (S/D) feature 350 is formed in the third hole 320 with reference to FIG. 9. Specifically, the source/drain (S/D) feature 350 is disposed on the conductive material 340 and surrounded by the inner electrode 333. In various embodiments, the source/drain (S/D) feature 350 may include, but not limited to, Si, SiP, SiAs, SiGe, Ge, a III-V group compound semiconductor, or graphene.

According to another aspect of the present disclosure, a stack capacitor structure 20a is provided. FIG. 9 is a cross-sectional view illustrating a stack capacitor structure according to some embodiments of the present disclosure. To make it easy to compare differences between various embodiments and simplify the descriptions, the same symbols are used to label the same members in the following various embodiments and mainly the differences between the various embodiments are described while duplicate parts are not described again.

Please refer to FIG. 9. The stack capacitor structure 20a includes a substrate 210, a first support layer 220, a first insulating layer 230, a second support layer 240, a third support layer 260, a second insulating layer 270, a third insulating layer 280, a fourth support layer 290, a first hole 250, a second hole 310, a third hole 320, and a capacitor 330. The first support layer 220 is disposed over the substrate 210. The first insulating layer 230 is disposed on the first support layer 220. The second support layer 240 is disposed on the first insulating layer 230. The material and other features of the substrate 210, the first support layer 220, the first insulating layer 230, and the second support layer 240 are as described in relation to the substrate 210, the first support layer 220, the first insulating layer 230, and the second support layer 240 shown in FIG. 2, and so will not be described here.

In some embodiments, the stack capacitor structure 20a may further include a wiring layer 211 disposed between the substrate 210 and the first support layer 220 as shown in FIG. 9. The material and other features of the wiring layer 211 are as described in relation to the wiring layer 211 shown in FIG. 2, and so will not be described here. In some embodiments, the stack capacitor structure 20a may further include a fourth insulating layer 221 disposed between the first support layer 220 and the first insulating layer 230 as shown in FIG. 9. The material and other features of the fourth insulating layer 221 are as described in relation to the fourth insulating layer 221 shown in FIG. 2, and so will not be described here.

The third support layer 260 is disposed on the second support layer 240. The material and other features of the third support layer 260 are as described in relation to the third support layer 260 shown in FIG. 5, and so will not be described here. The second insulating layer 270 is disposed on the third support layer 260. The third insulating layer 280 is disposed on the second insulating layer 270. The fourth support layer 290 is disposed on the third insulating layer 280. The material and other features of the second insulating layer 270, the third insulating layer 280, and the fourth support layer 290 are as described in relation to the second insulating layer 270, the third insulating layer 280, and the fourth support layer 290 shown in FIG. 6, and so will not be described here. It is noted that the material of the first insulating layer 230 is different from that of the second insulating layer 270, and the second insulating layer 270 includes SiO doped with boro-phospho-silicate glass (BPSG), in various embodiments. It is noted that the material of the first, second and fourth support layer 220, 240, 290 are the same and the material of the first support layer 220 is different from that of the third support layer 260. Specifically, the third support layer 260 includes SiN doped with carbon.

The first hole 250 penetrates through from a top surface of the second support layer 240 to a bottom surface of the first support layer 220. In the embodiment of excluding the fourth insulating layer 221, an upper edge of the first hole 250 has a width W3, a lower edge of the first hole 250 has a width W4, and the width W3 is greater than the width W4. In the embodiment of including the fourth insulating layer 221, an upper edge of the first hole 250 has a width W3, a lower edge of the first hole 250 has a width W4, and the width W3 is substantially equal to the width W4. The formation and other features of the first hole 250 are as described in relation to the first hole 250 shown in FIGS. 3-4, and so will not be described here.

The second hole 310 penetrates through from the third insulating layer 280 to a bottom surface of the third support layer 260. To be specific, the first hole 250 communicates with the second hole 310. The third hole 320 penetrates through from a top surface of the fourth support layer 290 to the third insulating layer 280. To be specific, the second hole 310 is aligned with the third hole 320. In one embodiment, the first hole 250 is aligned with the second and third holes 310, 320. In another embodiment, the first hole 250 is offset from the second and third holes 310, 320. The formation and other features of the second hole 310 and the third hole 320 are as described in relation to the second hole 310 and the third hole 320 shown in FIGS. 7-8, and so will not be described here.

The capacitor 330 disposed in the first, second, and third holes 250, 310, 320. In the embodiment of including the wiring layer, the first hole 250 penetrates through a portion of the wiring layer 211 and the capacitor 330 electrically connects the wiring layer 211. It is noted that the first hole 250 extends into the wiring layer 211, but do not penetrate through the wiring layer 211. In some embodiments, the capacitor 330 includes an outer electrode 331, a dielectric layer 332 and an inner electrode 333 in direct contact with each other. To be specific, the outer electrode 331 is conformally formed on sidewalls of the first and second hole 250, 310. The dielectric layer 332 is conformally formed on the sidewall of the outer electrode 331 and further extends to a sidewall of the third hole 320. The inner electrode 333 is conformally formed on the sidewall of the dielectric layer 332. In the embodiment of the second hole 310 being offset from the first hole 250, the capacitor 330 has a staircase profile between the second support layer 240 and the third support layer 260. The formation and other detail features of the capacitor 330 are as described in relation to the foregoing capacitor 330, and so will not be described here.

In some embodiments, the stack capacitor structure 20a may further include a conductive material 340 in direct contacts with the inner electrode 333. In some embodiments, the conductive material 340 fills up the first and second hole 250, 310 and extends into a portion of the third hole 320. The formation and other detail features of the conductive material 340 are as described in relation to the foregoing conductive material 340, and so will not be described here.

In some embodiments, the stack capacitor structure 20a may further include a source/drain (S/D) feature 350 disposed in the third hole 320 and surrounded by the inner electrode 333. In some embodiments, the top surface of the source/drain (S/D) feature 350 is leveled with the top surface of the fourth support layer 290. In some embodiments, the bottom surface of the source/drain (S/D) feature 350 in direct contacts with the inner electrode 333 and the conductive material 340. In some embodiments, the bottom surface of the source/drain (S/D) feature 350 is greater than a top surface of the conductive material 340. The formation and other detail features of the source/drain (S/D) feature 350 are as described in relation to the foregoing source/drain (S/D) feature 350, and so will not be described here.

In some embodiments, the stack capacitor structure 20a may further include a transistor (not shown) electrically connecting to the source/drain (S/D) feature 350.

FIG. 10 is a cross-sectional view illustrating a stack capacitor structure according to some embodiments of the present disclosure. With reference to FIG. 10, the stack capacitor structure 20b is the same as or similar in structure to the stack capacitor structure 20a. Further, the stack capacitor structure 20b may be formed by the same method as forming the stack capacitor structure 20a. Briefly, the difference between the stack capacitor structure 20b and the stack capacitor structure 20a is that, in this embodiment, the stack capacitor structure 20b does not include the fourth insulating layer 221 between the substrate 210 and the first support layer 220.

As is apparent from the above detailed description, the stack capacitor structure according to the invention can be made large enough to provide a sufficient capacity of the capacitor. Moreover, the present invention uses the high etching selectivity of the second insulating layer and the fourth insulating layer to increase the electrical contacting area thereby avoiding poor electrical contact of the subsequent capacitors. Therefore, a semiconductor memory device particularly suitable for large scale integration can be manufactured without problem.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of forming a stack capacitor structure, the method comprising:
    forming a first support layer over a substrate;
    forming a first insulating layer on the first support layer;
    forming a second support layer on the first insulating layer;
    forming a first hole penetrating through from a top surface of the second support layer to a bottom surface of the first support layer;
    forming a third support layer on the second support layer, wherein the first hole is sealed off by the third support layer;
    forming a second insulating layer on the third support layer;
    forming a third insulating layer on the second insulating layer;
    forming a fourth support layer on the third insulating layer;
    forming a second hole penetrating through from third insulating layer to a bottom surface of the third support layer and forming a third hole penetrating through from a top surface of the fourth support layer to the third insulating layer, wherein the first hole communicates with the second hole and the third hole;
    forming a capacitor in the first, second, and third holes, wherein forming the capacitor comprises:
        forming an outer electrode conformally along walls of the first and second holes;
        forming a dielectric layer conformally on the outer electrode and a sidewall of the third hole; and
        forming an inner electrode conformally on the dielectric layer.

2. The method of claim 1, wherein the operation for forming the second hole and the third hole comprising:
    removing first portions of the fourth support layer, the third insulating layer, the second insulating layer, and the third support layer to form a second initial hole, wherein an upper edge of the second initial hole has a fifth width, a lower edge of the second initial hole has a sixth width, and the fifth width is greater than the sixth width; and
    removing second portions of the fourth support layer, the third insulating layer, a second insulating layer, and the third support layer to form the second hole, wherein an upper edge of the second hole has a seventh width, a lower edge of the second hole has an eighth width, and the seventh width is substantially equal to the eighth width.

3. The method of claim 1, wherein materials of the first, second and fourth support layer are the same, the material of the first support layer is different from that of the third support layer, and the third support layer comprises SiN doped with carbon.

4. The method of claim 1, wherein a material of the first insulating layer is different from that of the second insulating layer, which comprises SiO doped with boro-phospho-silicate glass (BPSG).

5. The method of claim 1, further comprising:
    forming a wiring layer between the substrate and the first support layer, wherein the wiring layer electrically connects to the capacitor.

6. The method of claim 1, further comprising:
    forming a conductive material in direct contacting with the inner electrode, wherein the conductive material fills up the first and second hole and extends into a portion of the third hole.

7. The method of claim 6, further comprising:
    forming a source/drain (S/D) feature in the third hole, wherein the source/drain (S/D) feature is disposed on the conductive material and surrounded by the inner electrode.

8. The method of claim 1, further comprising:
    forming a fourth insulating layer between the first support layer and the first insulating layer.

9. The method of claim 8, wherein the operation for forming the first hole comprising:

removing first portions of the second support layer, the first insulating layer, the fourth insulating layer, and the first support layer to form a first initial hole, wherein an upper edge of the first initial hole has a first width, a lower edge of the first initial hole has a second width, and the first width is greater than the second width; and removing second portions of the second support layer, the first insulating layer, a fourth insulating layer, and the first support layer to form the first hole, wherein an upper edge of the first hole has a third width, a lower edge of the first hole has a fourth width, and the third width is substantially equal to the fourth width.

10. A stack capacitor structure, comprising:
a substrate;
a first support layer disposed over the substrate;
a first insulating layer disposed on the first support layer;
a second support layer disposed on the first insulating layer;
a third support layer disposed on the second support layer;
a second insulating layer disposed on the third support layer;
a third insulating layer disposed on the second insulating layer;
a fourth support layer disposed on the third insulating layer;
a first hole penetrating through from a top surface of the second support layer to a bottom surface of the first support layer;
a second hole penetrating through from the third insulating layer to a bottom surface of the third support layer, wherein the second hole communicates with the first hole;
a third hole penetrating through from a top surface of the fourth support layer to the third insulating layer, wherein the third hole is aligned with the second hole; and
a capacitor comprising:
an outer electrode conformally disposed along walls of the first hole and the second holes;
a dielectric layer conformally disposed on the outer electrode and a sidewall of the third hole; and
an inner electrode conformally disposed on the dielectric layer.

11. The stack capacitor structure of claim 10, wherein materials of the first, second and fourth support layer are the same, the material of the first support layer is different from that of the third support layer, and the third support layer comprises SiN doped with carbon.

12. The stack capacitor structure of claim 10, wherein a material of the first insulating layer is different from that of the second insulating layer, which comprises SiO doped with boro-phospho-silicate glass (BPSG).

13. The stack capacitor structure of claim 10, further comprising a fourth insulating layer disposed between the first support layer and the first insulating layer.

14. The stack capacitor structure of claim 10, further comprising a wiring layer disposed between the substrate and the first support layer.

15. The stack capacitor structure of claim 14, wherein the first hole penetrates through a portion of the wiring layer and the capacitor electrically connects to the wiring layer.

16. The stack capacitor structure of claim 10, further comprising a conductive material in direct contacts with the inner electrode, wherein the conductive material fills up the first and second hole and extends into a portion of the third hole.

17. The stack capacitor structure of claim 16, further comprising a source/drain (S/D) feature disposed in the third hole and surrounded by the inner electrode.

18. The stack capacitor structure of claim 17, further comprising a transistor electrically connecting to the source/drain (S/D) feature.

* * * * *